(12) United States Patent
Moon et al.

(10) Patent No.: US 7,595,468 B2
(45) Date of Patent: Sep. 29, 2009

(54) PASSIVE THERMAL SOLUTION FOR HAND-HELD DEVICES

(75) Inventors: Sung-won Moon, Phoenix, AZ (US); Suzana Prsitic, Chandler, AZ (US); Todd Young, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 481 days.

(21) Appl. No.: 11/268,979

(22) Filed: Nov. 7, 2005

(65) Prior Publication Data

US 2007/0103849 A1    May 10, 2007

(51) Int. Cl.
*H05B 3/06* (2006.01)
*H05K 7/20* (2006.01)

(52) U.S. Cl. .................. 219/540; 361/679; 361/687; 361/703; 361/704; 257/777; 257/676

(58) Field of Classification Search ............... 219/540; 361/679, 687, 703–704, 676, 777; 257/777, 257/676
See application file for complete search history.

(56) References Cited

U.S. PATENT DOCUMENTS

| 6,947,282 B2 * | 9/2005 | Hotta et al. ............... 361/699 |
| 2004/0130869 A1 * | 7/2004 | Fleck et al. ............... 361/687 |
| 2004/0169285 A1 * | 9/2004 | Verma et al. ............... 257/777 |

* cited by examiner

*Primary Examiner*—Shawntina Fuqua
(74) *Attorney, Agent, or Firm*—Kenneth A. Nelson (57) ABSTRACT

The present invention relates to a thermal solution for hand-held devices. In an embodiment, the present invention implements a thermal gap filler and a system enclosure for effective thermal management of high performance hand-held devices. In an embodiment, a hand-held device of the present invention increases the thermal power dissipation capability by reducing its system thermal resistance.

4 Claims, 6 Drawing Sheets

| | SYSTEM ENCLOSURE | GAP FILLER | HEAT SPREADER BETWEEN GAP FILLER AND SYSTEM ENCLOSURE |
|---|---|---|---|
| CASE 1 (BASELINE) | K = 0.2 (REGULAR ENCLOSURE) | NO | NO |
| CASE 2 | K = 0.2 | K = 1 | COPPER HEAT SPREADER 30mm X 30mm X0.5mm |
| CASE 3 | K = 20 | K = 1 | NO |
| CASE 4 | K = 20 | K = 1 | COPPER HEAT SPREADER 30mm X 30mm X0.5mm |
| CASE 5 | K = 20 | K = 10 | NO |

PASSIVE THERMAL SOLUTION FOR HAND-HELD DEVICES

BACKGROUND

Currently, hand-held products such as cell phones and PDA's are equipped with features to provide multiple modes of communication, organization, storage, etc.

Additional features boost power consumption, which increases the challenge of thermal solutions for hand-held devices subject to ever-increasing size constraints. As a result, package and system power densities increase leading to significant temperature elevation. This may also lead to performance deterioration, package delamination, and reliability issues.

DETAILED DESCRIPTION

In an embodiment, the present invention includes a passive thermal solution for hand-held devices. In an embodiment, the passive thermal solution may comprise a gap filler and a thermally conductive casing to dissipate heat produced by mechanical and/or electronic components in the hand-held device. In an embodiment, the gap filler used in the hand-held device is a thermal gap filler. In an embodiment, the thermal conductivity of the thermally conductive casing may be approximately 2.0 W/m-K or greater.

Figure 1:
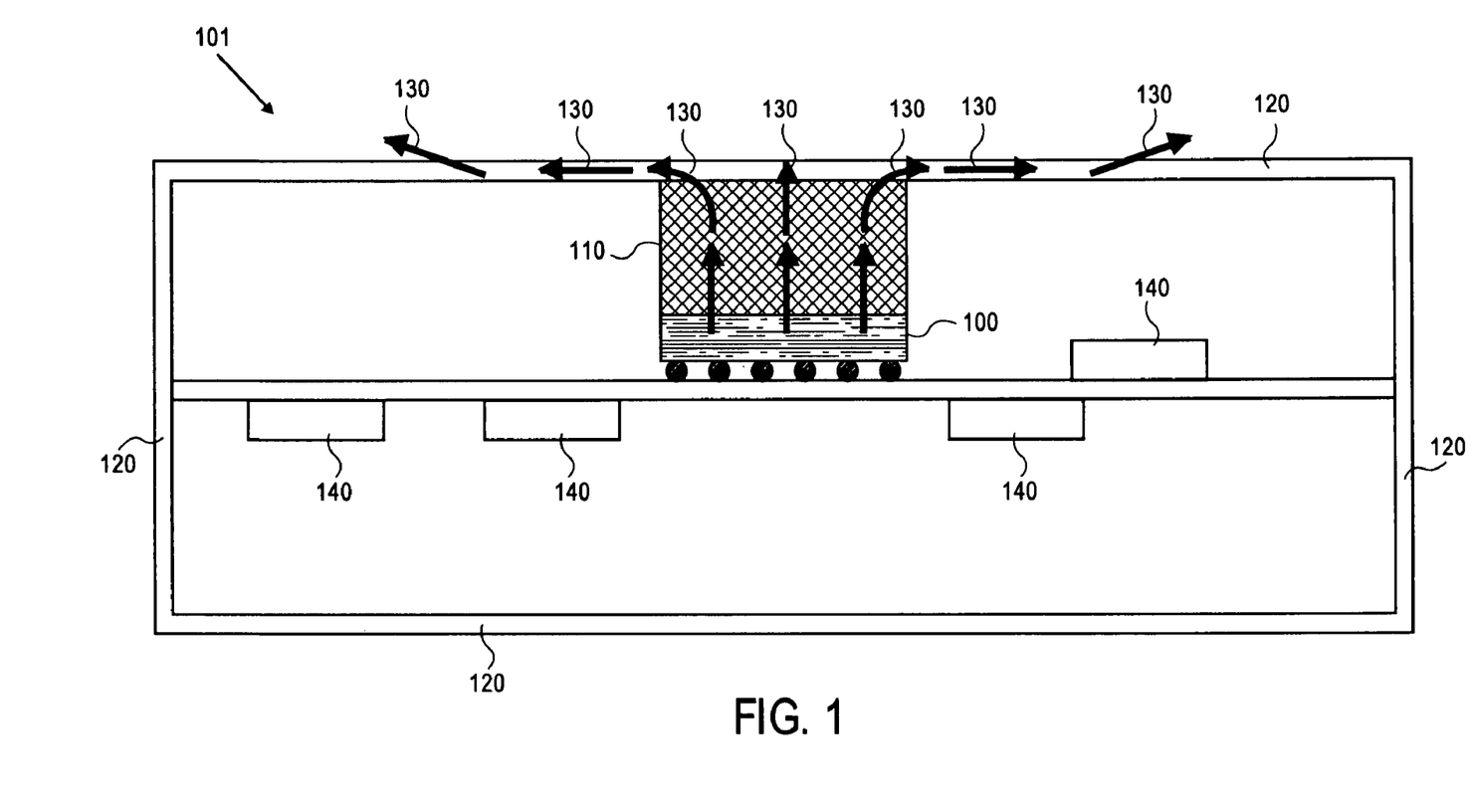
FIG. 1 is an illustration of a hand-held device, which features a thermal gap filler above an electronic package and enclosed by a thermally conductive casing according to an embodiment of the present invention.

FIG. 1 is a cross-sectional view of hand-held device 101, which may feature thermally conductive casing 120, thermal gap filler 110, electronic package 100, mechanical and electronic components 140. As illustrated, thermally conductive casing 120 may enclose embedded components of hand-held device 101. FIG. 1 also illustrates thermal gap filler 110 positioned flush between electronic package 100 and a portion of thermally conductive casing 120. In other embodiments, thermally conductive casing 120 may at least partially enclose, but not fully enclose, components of hand-held device 101. In some embodiments, hand-held device 101 may include a power supply such as a battery and may not operate for periods of time while not connected to an external source of power. Under such conditions, the power supply may provide limited power so that use of active cooling solutions, such as fans, etc, may be impractical.

In an embodiment, the operation of hand-held device 101 produces heat. The production of heat within hand-held device 101 can have a detrimental effect on the functionality of the embedded components. In an embodiment of the present invention, heat may dissipate to an ambient exterior to hand-held device 101 via conduction through thermal gap filler 110 and thermally conductive casing 120.

In an embodiment of the present invention, thermal gap filler 110 may be positioned between a portion of thermally conductive casing 120 and electronic package 100. In an embodiment, thermal gap filler 110 passively facilitates heat transfer from electronic package 100 to thermally conductive casing 120. In an embodiment, thermal gap filler 110 comprises acrylate resin. In an embodiment when thermal gap filler 110 comprises an acrylate resin, the thermal conductivity of thermal gap filler 110 is approximately 1 W/m-K. In an embodiment when thermal gap filler comprises silicone, the thermal conductivity of thermal gap filler 110 is approximately 10 W/m-K. In an embodiment, thermal gap filler 110 may have a thermal conductivity in the range of 1 W/m-K to 10 W/m-K. In another embodiment, the thermal gap filler 110 may have a thermal conductivity in a range between about 5 W/m-K to about 15 W/m-K. In other embodiments, the thermal gap 110 filler may have a different thermal conductivity.

In an embodiment, a thermal gap filler 110 with a thermal conductivity of at least 1 W/m-K may sufficiently facilitate heat transfer to thermally conductive casing 120. In this embodiment, thermal gap filler 110 transfers heat to thermally conductive casing 120 well. In an embodiment when the temperature of electronic package 100 is greater than the temperature of thermal gap filler 110, heat is transferred from electronic package 100 to thermal gap filler 110. In an embodiment, thermal gap filler 110 acts as a heat conduit from which heat produced from electronic package 100 is transferred to thermally conductive casing 120 through thermal gap filler 110.

In an embodiment of the present invention, thermally conductive casing 120 may serve as the system enclosure to fully or partially enclose the embedded components of hand-held device 101 as illustrated in FIG. 1. In an embodiment, thermally conductive casing 120 comprises a polycarbonate material which features a thermal conductivity of approximately 0.2 W/m-K. Thermally conductive casing 120 may comprise a liquid crystalline polymer. In an embodiment when thermally conductive casing comprises a liquid crystalline polymer, the thermal conductivity of thermally conductive casing 120 is approximately 2.0 W/m-K. In an embodiment, thermally conductive casing 120 may comprise a polyphenylene sulfide, which may have a thermal conductivity of approximately 20 W/m-k. In other embodiments, the thermally conductive casing 120 may comprise a polybutene terephthalate, polypropylene, thermoplastic elastomer, polyamide, magnesium or another material. In an embodiment, thermally conductive casing 120 may have a thermal conductivity in the range from 2.0 to 20 W/m-K although other thermal conductivities are also possible in other embodiments.

In an embodiment, thermally conductive casing 120 with a thermal conductivity of at least 2.0 W/m-K is sufficient to transfer heat to an ambient outside of hand-held device 101. In an embodiment, the temperature of thermal gap filler 110 is greater than the temperature of thermally conductive casing 120 such that heat is transferred from thermal gap filler 110 to thermally conductive casing 120. In an embodiment, heat is transferred from thermal gap filler 110 to a thermally conductive casing 120 and is subsequently transferred to an ambient outside of hand-held device 101.

In an embodiment, an electronic package 100 may provide all or part of the electronic functionality of hand-held device 101. In an embodiment when electronic package 100 is a microprocessor and is active, heat 130 is conducted through thermal gap filler 110 throughout the inner area of hand-held device 101. In FIG. 1, heat 130 is conducted through thermal gap filler 110 but may also be conducted through other components and in different directions throughout hand-held device 101. In an embodiment, heat 130 may increase the temperature of hand-held device 101. In an embodiment, the use of thermal gap filler 110 and thermally conductive casing 120 prevents the temperature of hand-held device 101 from elevating to affect the electrical or mechanical functions of the device. In an embodiment, without the passive thermal solution provided by thermal gap filler 110 and thermally conductive casing 120 the temperature of hand-held device 101 may increase so much as to adversely affect the operation of the device.

Figure 2:
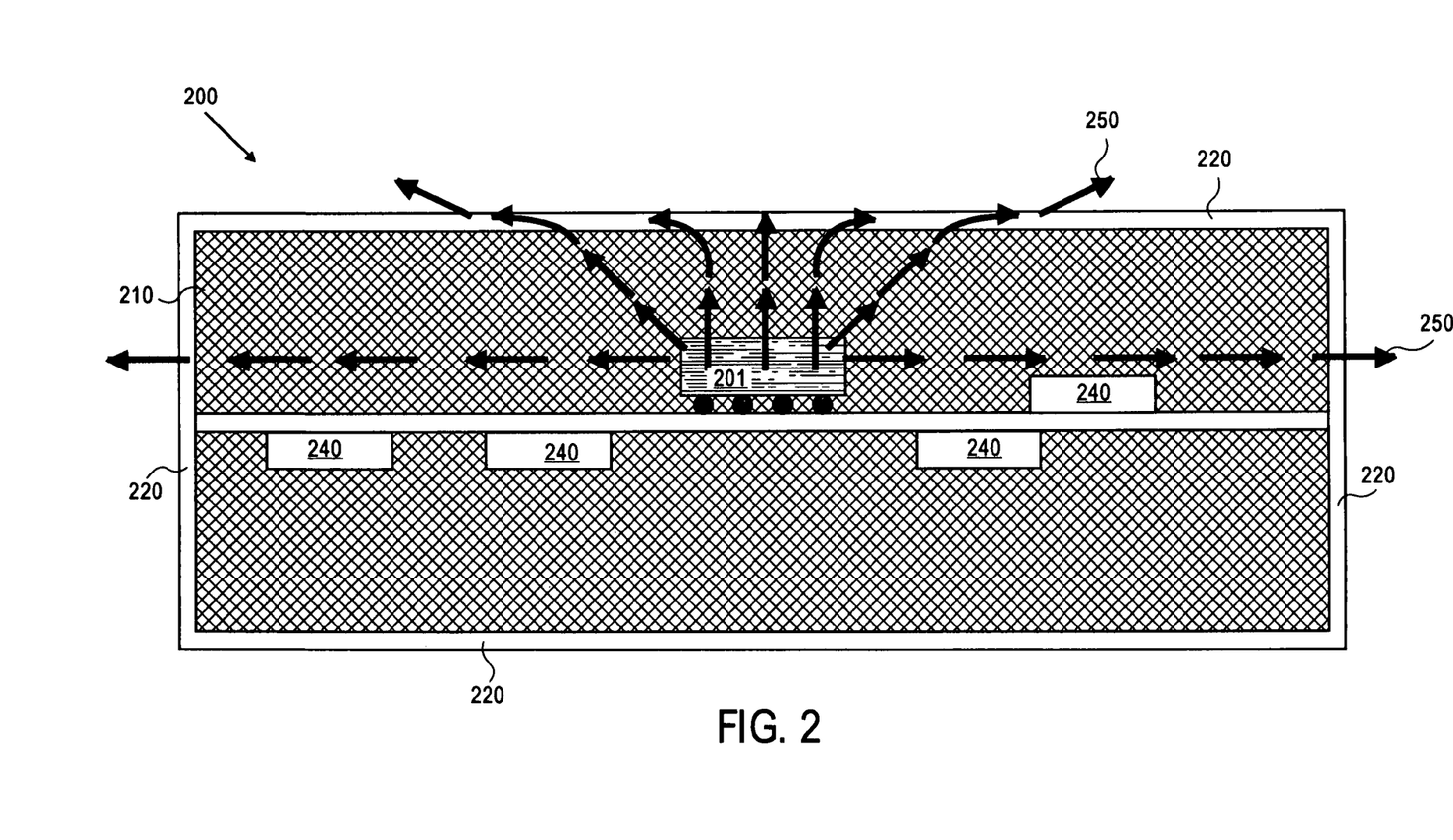
FIG. 2 is an illustration of a hand-held device, which features a thermal gap filler encompassing the entire area enclosed by the thermally conductive casing not occupied by the electronic package or other system components according to an embodiment of the present invention.

FIG. 2 is a cross-sectional view of hand-held device 200, which features thermal gap filler 210 substantially filling the volume enclosed by thermally conductive casing 220 not filled by other mechanical or electronic components within thermally conductive casing 220. In an embodiment as illustrated in FIG. 2, thermal gap filler 210 may be positioned flush with electronic package 201 providing a path for heat 250 to thermally conductive casing 220 for subsequent dissipation from hand-held device 200. FIG. 2 further illustrates mechanical and electronic components 240 in contact with thermal gap filler 210.

In yet another embodiment of the present invention, a thermal gap filler may partially fill the volume of thermally conductive casing 120. In an embodiment, a thermal gap filler may fill more of the volume of thermally conductive casing 120 than filled by thermal gap filler 110 in FIG. 1, but not fill as much of the volume of thermally conductive casing as illustrated by thermal gap filler 210 in FIG. 2.

In an embodiment of the present invention, a heat spreader may be incorporated in the hand-held device. In an embodiment, a heat spreader may be incorporated to increase the thermal dissipation capabilities of hand-held devices.

Figure 3:
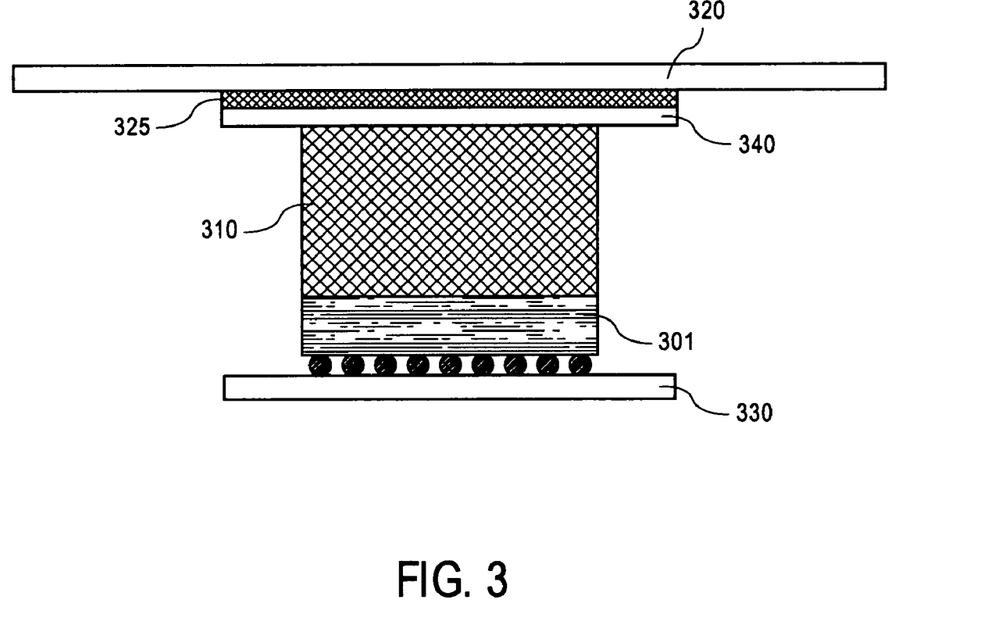
FIG. 3 is a cross-sectional view of a hand-held device featuring a heat spreader and a thermal gap filler above an electronic package according to an embodiment of the present invention.

In an embodiment as illustrated in FIG. 3, heat spreader 340 is positioned above electronic package 301 and between thermal gap filler 310 and thermally conductive casing 320. In an embodiment, a thermal interface material 325 may span a portion of thermally conductive casing 320 as illustrated. Also, electronic package 301 may be positioned on substrate 330 according to an embodiment of the present invention.

Figure 4:
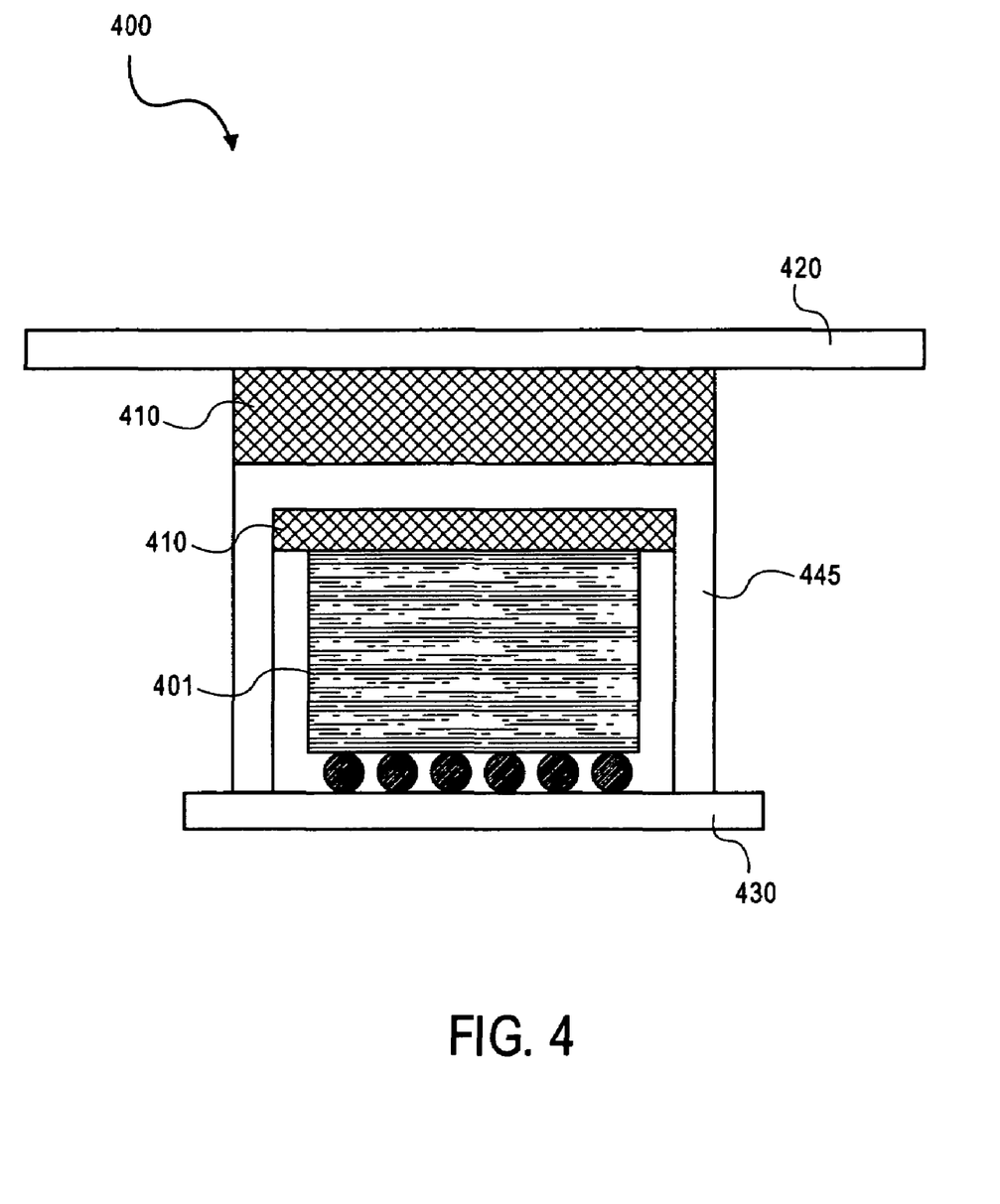
FIG. 4 is a cross-sectional view of a hand-held device featuring an electronic package and an EMI shield exterior to the electronic package according to an embodiment of the present invention.

In an embodiment of the present invention, the hand-held device may incorporate an EMI shield. In an embodiment as illustrated in FIG. 4, EMI shield 445 may be incorporated in hand-held device 400 to protect an ambient surrounding hand-held device 400 from the effects of electromagnetic waves. In an embodiment as illustrated in FIG. 4, EMI shield 445 may be positioned above electronic package 400 and between two sections of thermal gap filler 410. In an embodiment, EMI shield 445 is positioned between two sections of thermal gap filler 410 to minimize contact resistance. In an embodiment, EMI shield 445 may comprise metal and have a thermal conductivity of 150-400 W/m-K.

Figure 5A:
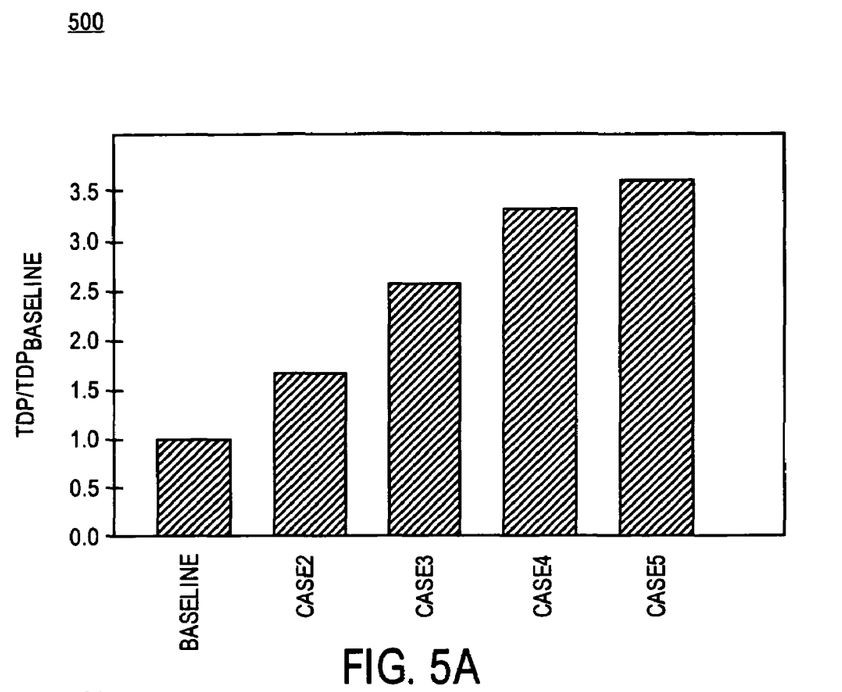
FIG. 5A is a chart of the maximum power dissipation ratio of a hand-held device according to varying embodiments of the present invention.
Figure 5B:
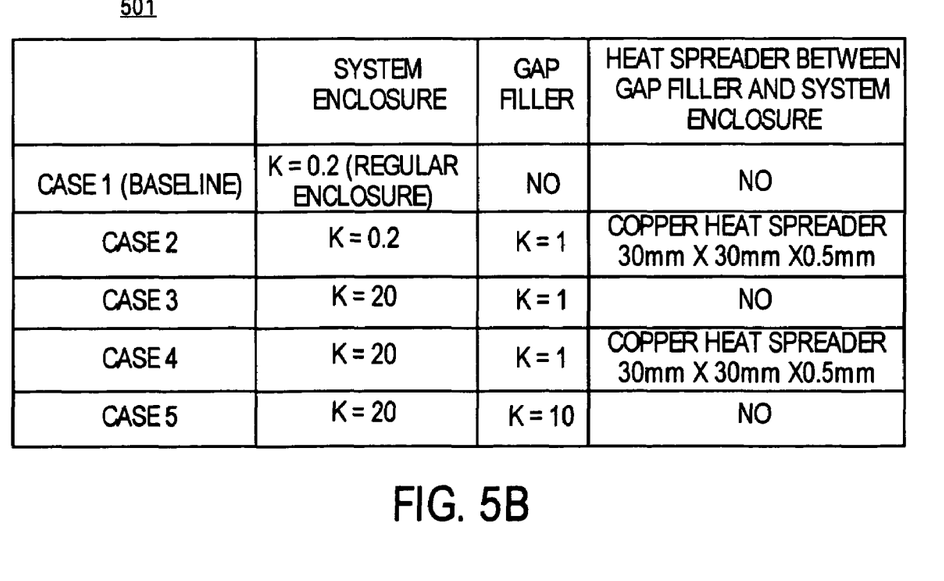
FIG. 5B is a chart, corresponding with the embodiments in FIG. 5A, listing key thermal dissipation components and their thermal conductivities according to embodiments of the present invention.

In an embodiment, the hand-held device of the present invention may exhibit better heat dissipation ability than hand-held devices currently in the art. FIG. 5A features chart 500, which exhibits the thermal dissipation power (TDP) of current hand-held devices and that of multiple hand-held device embodiments of the present invention. FIG. 5B features chart 501, which corresponds to chart 500 and provides the setup of a hand-held device according to varying embodiments along with the corresponding thermal conductivities (k) of the system enclosure and thermal gap filler.

Chart 500 of FIG. 5A and chart 501 of FIG. 5B illustrate the thermal dissipation power of hand-held devices of the current state of the art and multiple embodiments of the present invention. In an embodiment, an electronic package produces the same quantity of heat in the hand-held device embodiments listed in chart 500 and chart 501. In an embodiment as exhibited in chart 500 of FIG. 5A, Case 1 (Baseline) may represent a hand-held device of the current state of the art. In an embodiment, Baseline may represent a hand-held device which features a system enclosure with a thermal conductivity of 0.2 W/m-K. In an embodiment, Case 2 may represent a hand-held device which features a system enclosure, a thermal gap filler with a thermal conductivity of 1 W/m-K, and a copper heat spreader. In an embodiment, Case 3 may represent a hand-held device which features a system enclosure and a thermal gap filler with thermal conductivities of 20 W/m-K, 1 W/m-K respectively. In an embodiment, Case 4 may represent a hand-held device which features a system enclosure and a thermal gap filler, with a thermal conductivity of 20 W/m-K, 1 W/m-K respectively, and a copper heat spreader. In an embodiment, Case 5 may represent a hand-held device which features a system enclosure and a thermal gap filler with thermal conductivities of 20 W/m-K, 10 W/m-K respectively.

In an embodiment as illustrated in FIG. 5A, the thermal dissipation power (TDP) of a hand-held device may be greater by the use of a thermal gap filler and thermally conductive casing as exhibited by Case 2, Case 3, Case 4, and Case 5 in chart 500. In an embodiment as further illustrated in chart 500, the thermal dissipation power (TDP) of a hand-held device may be greater with the use of a heat spreader as illustrated in Case 3 and Case 4.

Figure 6:
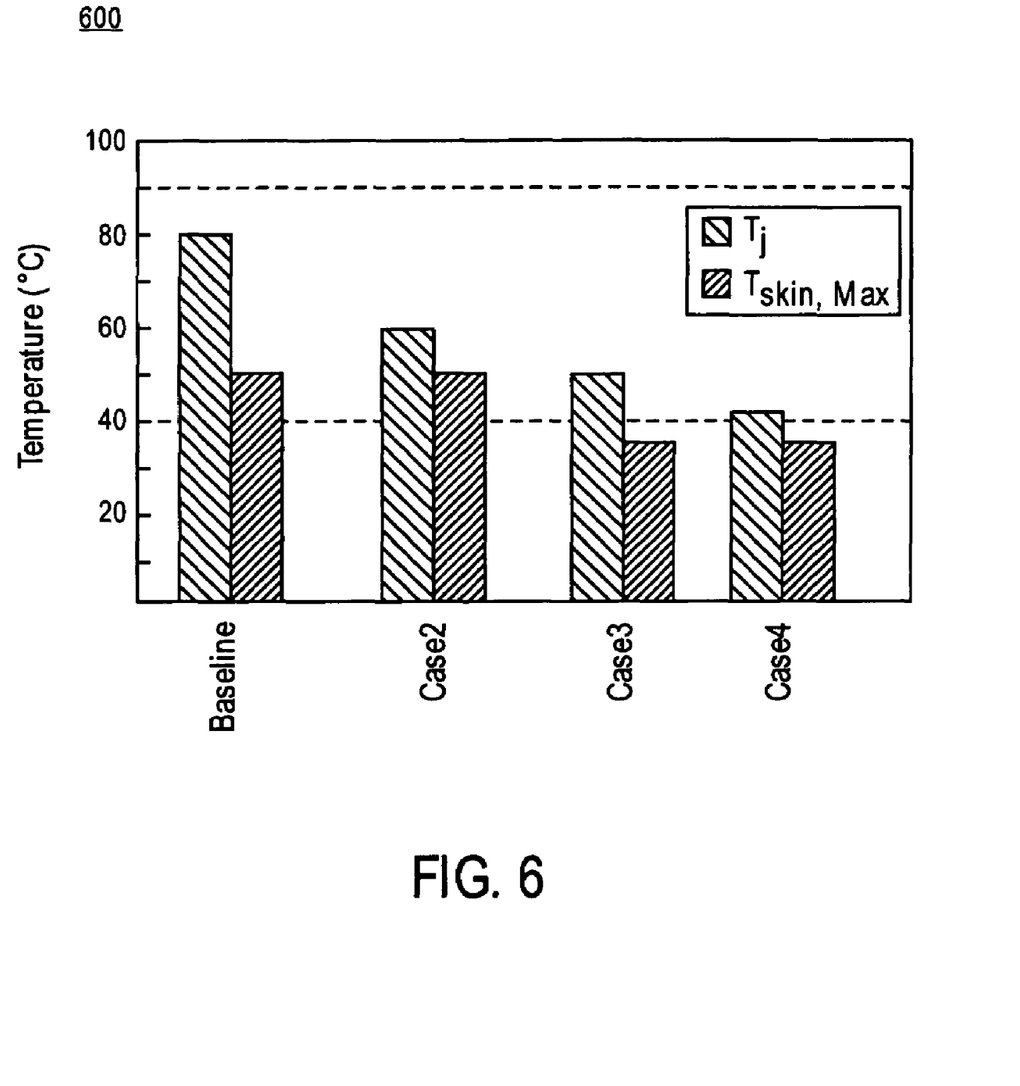
FIG. 6 is a chart which exhibits the use of a thermal gap filler and system enclosure with increasing thermal conductivities to decrease the electronic package and system enclosure temperatures according to embodiments of the present invention.

In an embodiment as illustrated in chart 600 of FIG. 6, the die junction temperature, $T_j$, and system enclosure temperature, $T_{skin}$, may be less in a hand-held device comprising a thermal gap filler and system enclosure with increasing thermal conductivity properties. In an embodiment, chart 600 corresponds with chart 500 and chart 501 in FIG. 5A and FIG. 5B with the exception of Case 5. As exhibited in chart 600, the die junction temperature and temperature of the system enclosure decreases with the use of a thermal gap filler and a system enclosure with increasing thermal conductivities. Also, the use of a heat spreader within a hand-held device aids to decrease the temperature of both die and system enclosure as exhibited by Case 3 and Case 4 in chart 600. In an embodiment, the present invention's ability to dissipate heat outside the hand-held device may allow the device to function better.

In an embodiment, the hand-held device of the present invention may be manufactured such that the hand-held device of the present invention features a thermally conductive casing with a thermal conductivity greater than 2.0 W/m-k, an electronic package embedded inside the thermally conductive casing, and a thermal gap filler positioned between the thermally conductive casing and the electronic package. In an embodiment, the hand-held device may be manufactured such that the thermal gap filler provides a heat path from the electronic package to the thermally conductive casing. In an embodiment, the heat path created by the thermal gap filler is substantially free from air gaps. In yet another embodiment, the hand-held device of the present invention may be manufactured such that the thermal gap filler substantially fills the volume enclosed by said thermally conductive casing not filled by other components within said thermally conductive casing.

The invention claimed is:

1. A device comprising:
   a thermally conductive casing;
   an electronic package at least partially enclosed in said thermally conductive casing; and
   a gap filler above said electronic package, wherein the thermal conductivity of said gap filler is greater than about 1 W/m-K and wherein an EMI shield is disposed between a first portion and a second portion of said gap filler.

2. The device of claim 1, wherein the thermal conductivity of said EMI shield is greater than 150 W/m-K.

3. The device of claim 1, further comprising a heat spreader above said first portion and said second portion of said gap filler.

4. The device of claim 1, wherein said device is a hand-held device; and
   said gap filler substantially fills the volume enclosed by said thermally conductive casing not filled by other components within said thermally conductive casing; and
   further comprising a heat spreader above said gap filler.

* * * * *

UNITED STATES PATENT AND TRADEMARK OFFICE
CERTIFICATE OF CORRECTION

PATENT NO.       : 7,595,468 B2                                      Page 1 of 1
APPLICATION NO.  : 11/268979
DATED            : September 29, 2009
INVENTOR(S)      : Moon et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 805 days.

Signed and Sealed this

Twenty-eighth Day of September, 2010

David J. Kappos
*Director of the United States Patent and Trademark Office*